United States Patent
Clark

(10) Patent No.: US 9,900,017 B1
(45) Date of Patent: Feb. 20, 2018

(54) DIGITAL TO ANALOG CONVERSION USING SEMI-DIGITAL FIR FILTER

(71) Applicant: Apple Inc., Cupertino, CA (US)

(72) Inventor: Brian D. Clark, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/485,781

(22) Filed: Apr. 12, 2017

(51) Int. Cl.
| | |
|---|---|
| H03M 1/66 | (2006.01) |
| H03M 1/06 | (2006.01) |
| H03K 5/15 | (2006.01) |
| H03H 17/02 | (2006.01) |
| H03F 3/181 | (2006.01) |

(52) U.S. Cl.
CPC ...... H03M 1/0626 (2013.01); H03H 17/0248 (2013.01); H03K 5/15046 (2013.01); H03M 1/66 (2013.01); H03F 3/181 (2013.01); H03F 2200/03 (2013.01)

(58) Field of Classification Search
CPC ........ H03M 1/0626; H03M 1/66; H03M 1/12; H03M 3/50; H03M 3/30; H03M 7/3004; H03H 17/0248; H03K 5/15048; H03F 2200/03; H03F 3/181
USPC ......................................... 341/144, 143, 150
See application file for complete search history.

(56) References Cited

U.S. PATENT DOCUMENTS

| | | | | |
|---|---|---|---|---|
| 4,812,815 A * | 3/1989 | Miyakoshi | ............ | H03M 3/346 341/144 |
| 6,011,501 A * | 1/2000 | Gong | ................... | H03M 3/504 341/150 |
| 6,844,838 B2 | 1/2005 | Mallinson | | |
| 7,075,468 B1 | 7/2006 | Pellon | | |
| 7,372,384 B1 * | 5/2008 | Xu | ........................ | H03M 3/368 341/143 |
| 7,528,754 B1 | 5/2009 | Bakkaloglu et al. | | |
| 8,736,475 B1 * | 5/2014 | Harrison | ............... | H03M 3/504 341/143 |
| 2015/0341046 A1 | 11/2015 | Schinkel et al. | | |

OTHER PUBLICATIONS

Heylen, Robert L., et al., "The Integrating Finite Impulse Response Filter", *AES, An Audio Engineering Society Reprint*, Presented at the 94th Convention, (Mar. 16-19, 1993), 1-25.

Sadeghifar, M. R., "On High-Speed Digital-to-Analog Converters and Semi-Digital FIR Filters", *Linkoping Studies in Science and Technology*, Thesis No. 1708, (Dec. 17, 2014), 71 pages.

Singh, Niraja, et al., "FIR (Sparse) Filter Design Using IST Algorithm", *International Journal of Innovations in Engineering and Technology*, vol. 2 Issue 2, (Apr. 2013), 386-394.

\* cited by examiner

*Primary Examiner* — Jean B Jeanglaude
(74) *Attorney, Agent, or Firm* — Womble Bond Dickinson (US) LLP

(57) ABSTRACT

A semi-digital finite impulse response, FIR, filter is configured as a sparse FIR filter and as a minimum phase lag FIR filter. The FIR filter has a delay line composed of a number of sets of delay units sequentially coupled to each other, and where some of the sets of delay units have one or more untapped delay units as part of a cascade of two or more single-sample delay units. An analog summing node is coupled to the taps and produces at its output an analog version of a digital input signal that is fed to an input of the delay line. Other embodiments are also described and claimed.

17 Claims, 5 Drawing Sheets

DIGITAL TO ANALOG CONVERSION USING SEMI-DIGITAL FIR FILTER

FIELD

An embodiment of the invention is directed to digital to analog conversion of digital audio signals. Other embodiments are also described.

BACKGROUND

When converting a digital audio signal or other type of band-limited digital signal into analog form, it is desirable to preserve a given frequency band of the signal content, while filtering out unwanted frequencies in other bands (typically higher in frequency than the desired band). For example, digital to analog conversion often inherently exhibits a low pass filtering effect, which removes out of band noise in the resulting output analog signal.

When the analog output of a digital to analog converter is fed to an amplifier, such as a class D amplifier, out of band noise can have a negative interaction with the particular amplification process, and can alias back into the desired band, corrupting the output signal and making it unpleasant to listen to or even unusable. Low-pass filtering for removing the out of band noise during a digital to analog conversion process may be performed through the use of a semi-digital finite impulse response (FIR) filter. The input to the filter may be a pulse density modulated (PDM) digital audio signal, and the semi-digital FIR filter uses the digital input values to switch its voltage mode or current steering mode configuration on and off to generate an analog output version of the digital input signal that is also inherently low-pass filtered. In a conventional design, the coefficients of the semi-digital FIR filter are computed using classical digital filter design techniques in which the filter is constrained to be a linear phase filter, which results in a symmetrical set of FIR filter coefficients being computed.

SUMMARY

An embodiment of the invention is a digital to analog conversion (DAC) circuit that has a semi-digital FIR filter whose corner frequency, as a low pass filter, for example, can be advantageously lowered, relative to conventional techniques, but without increasing the number of taps (or filter coefficients.) The filter has a number of sets of delay units that are sequentially coupled to each other to form a delay line whose input is to receive the digital input signal (e.g., a band-limited signal such as a digital audio signal). Each set of delay units is a cascade of two or more, single-sample delay units. A number of taps are coupled to the delay line. Each tap has an input that is coupled to the output of a respective one of the sets of delay units. An analog summing node combines the output signals from the taps, to yield an analog version of the digital input signal. In each set of delay units, there is at least one delay unit that is "untapped." The addition of such untapped delay units result in what is referred to here as an imaged FIR filter that advantageously results in a lowered corner frequency, for the same number of filter coefficients in an un-imaged version. In addition, where latency of the conversion is especially of concern, then the design of the coefficients of the semi-digital FIR filter can be constrained to yield a minimum phase lag filter (rather than a linear phase filter.) The minimum phase filter can achieve the same frequency response as a linear phase filter but at a lower latency in a significant range of the operating frequency band except perhaps in a top octave or an uppermost frequency band.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. Also, in the interest of conciseness and reducing the total number of figures, a given figure may be used to illustrate the features of more than one embodiment of the invention, and not all elements in the figure may be required for a given embodiment.

DETAILED DESCRIPTION

Several embodiments of the invention with reference to the appended drawings are now explained. Whenever the shapes, relative positions and other aspects of the parts described in the embodiments are not explicitly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 5:
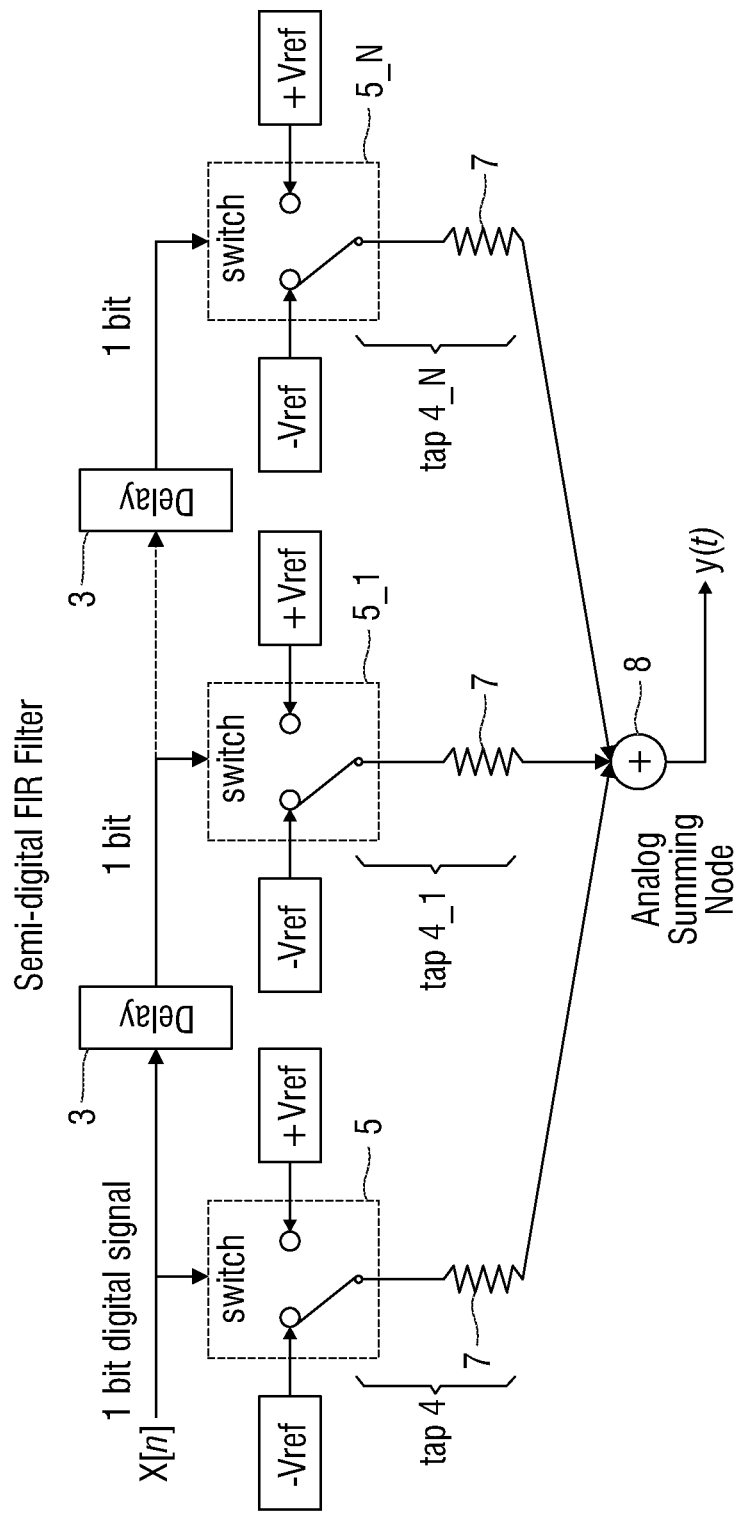
FIG. 5 is a block diagram and circuit schematic of a technique for digital to analog conversion using a semi-digital FIR filter that is non-imaged.

An embodiment of the invention is a digital to analog conversion (DAC) circuit that uses a semi-digital FIR filter structure whose corner frequency may be lowered relative to a conventional "non-imaged" FIR filter having the same number of filter coefficients. Before describing an imaged semi-digital FIR filter, FIG. 5 is used to illustrate an example non-imaged semi-digital FIR filter. An input 1-bit digital signal or sequence, x[n], is fed to the input of a delay line composed of N delay units (each delay unit 3 being a one sample delay.) The delay units 3 may be implemented directly in memory within a digital system or they may be a part of dedicated hardware DAC circuit. The delay line serves to contain a history of the input sequence x[n]. The stored samples are "tapped" to control a corresponding number of coefficients of the FIR filter. For example, an FIR filter that has 10 coefficients would contain a delay line that would hold the most recent input sample, as well as the previous 9 input samples. When a new sample arrives, in x[n], the oldest is removed from the delay line.

Figure 2A:
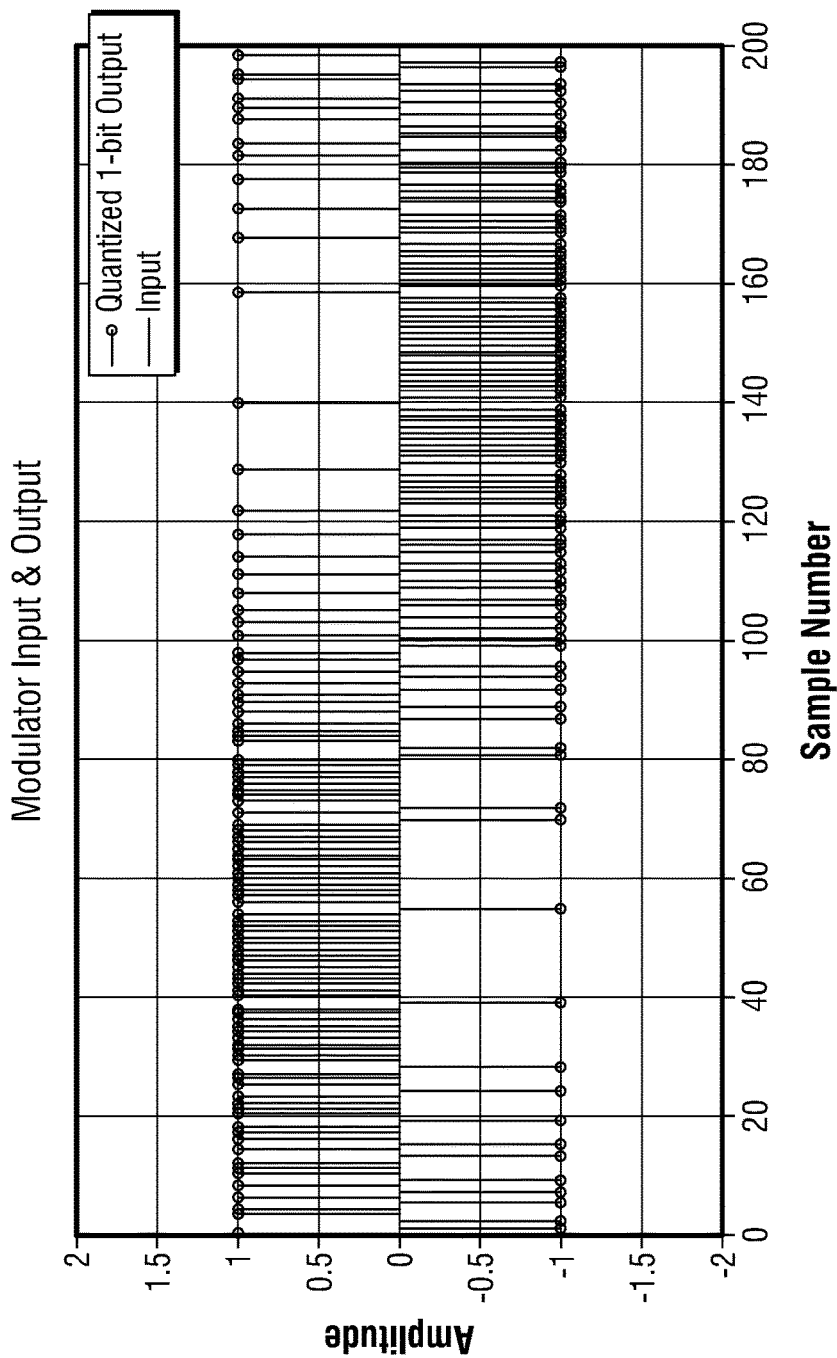
FIG. 2a depicts an example of an input to a modulator, as a pure sinusoid, and its corresponding output, as a pulse density modulation (PDM) 1-bit digital stream.
Figure 2B:
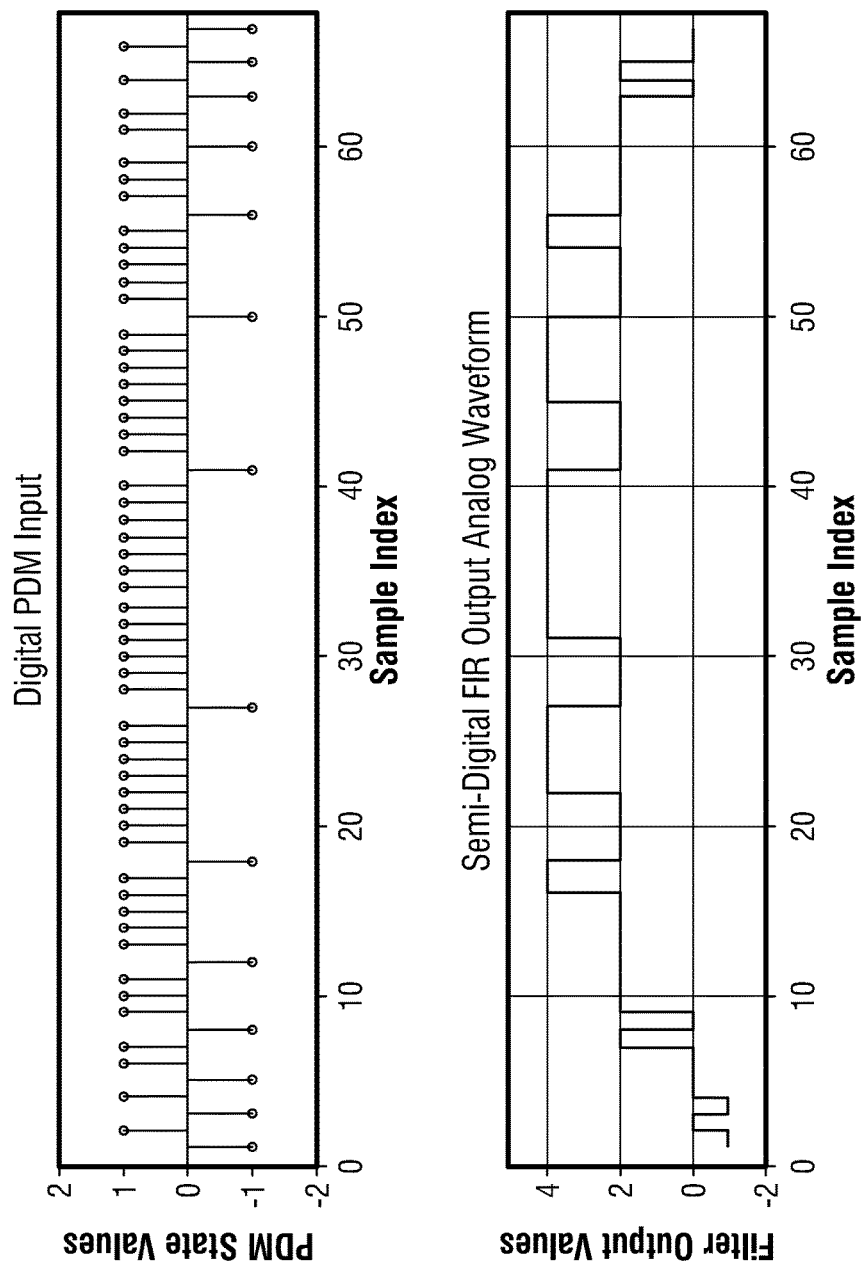
FIG. 2b shows a portion of a single period of the input PDM sequence, and the analog output waveform of the imaged semi-digital FIR filter circuit of FIG. 1.

FIG. 2a shows an example of an input sequence being a pure sinusoid that a modulator has converted into the form of a 1-bit pulse density modulation (PDM) stream. The samples or bits in the modulator outputs PDM stream are arranged such that, for example, a higher density of +1 samples (over a given time interval) indicates a larger input level, while a lower density indicates a smaller input level. This input PDM sequence is then "converted" into analog form by the semi-digital FIR filter structure of FIG. 5, as an analog value y(t) as shown in FIG. 2b. The analog output y(t) may be produced or updated at the same rate as the input PDM sequence. As seen in FIG. 2b, the analog output may exhibit a staircase wave form, which can be filtered by a reconstruction filter, such as an analog low pass filter (not shown), before being applied downstream, for example as an input to an audio amplifier (not shown.)

In the example shown in FIG. 2a, being a PDM stream, the density of +1 bits or −1 bits within a given sequence of samples (length or time interval) is proportional to the input value, such that in this case a value 0 has a low density of "logical 1s" in the PDM stream, whereas a larger value such as 127 or 128 has a much higher density of "logical 1s". For this 1-bit PDM stream, each sample may be binary, either a "logical 1" or a "logical 0" that map to in this example an algorithmic value of "+1" or "−1". This is but one possibility from among several techniques for representing the digital values within a stream x[n]. Other modulation approaches are possible, such as a 1.5 bit PDM stream in which each sample of the PDM stream may be ternary, for example either "−1", "0", or "+1" (or other combination of three different signal values.)

Returning to FIG. 5, the FIR filter has a number of taps coupled to the delay line, where each tap may have a defined weighting (relative to the others.) For each portion of the input sequence having N+1 binary values or bits, there are N+1 coefficients or taps each of which is receiving as a control signal a respective one of N+1 binary values or bits of the input sequence x[n]. The outputs of the weighted taps are combined at an analog summing node 8. The output of the latter is the analog version of the digital value (that appears in the input signal x[n].) This analog output may be updated at the same rate as the input sequence x[n].

Figure 4:
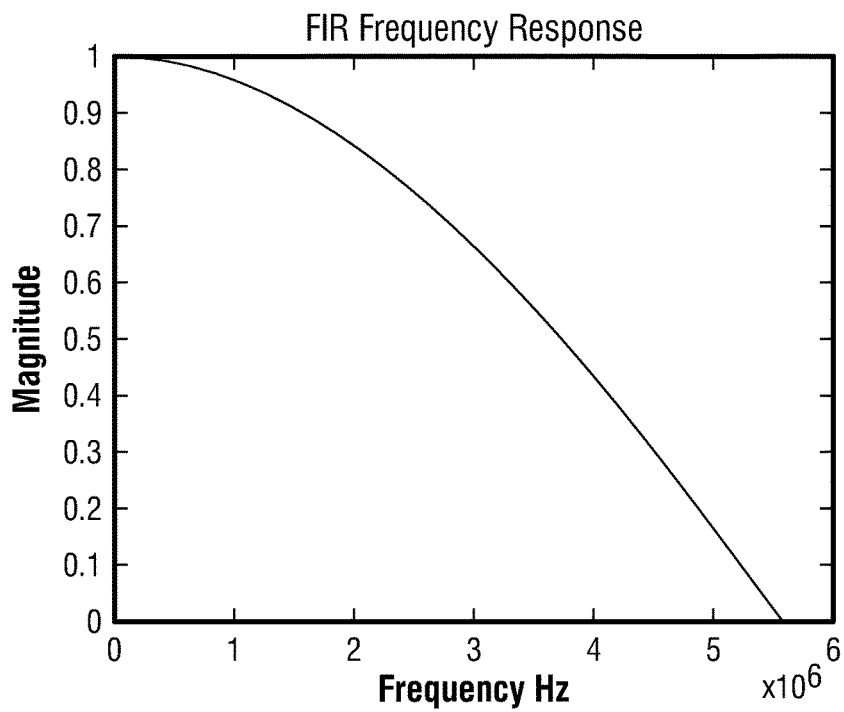
FIG. 4 illustrates the magnitude frequency response of a non-imaged FIR filter.

The filter has N taps 4_1, 4_2 ... 4_N, which are coupled sequentially to the delay line, wherein each tap has an input that is coupled to the output of a respective one of the delay units 3. There is also an initial tap 4 that has an input coupled to the input of the delay line (and an output that is coupled to a further input of the analog summing node 8.) In this case, the taps of the semi-digital filter have a voltage mode configuration, each tap having voltage sources +Vref and −Vref one of which is selected by the current sample of the input sequence x[n], and is combined through a resistor 7 at the analog summing node 8, to yield the analog output y(t). FIG. 4 illustrates an example frequency response of the filter, based on a sampled version of the analog output y(t), where the low pass filter effect is apparent.

Figure 1:
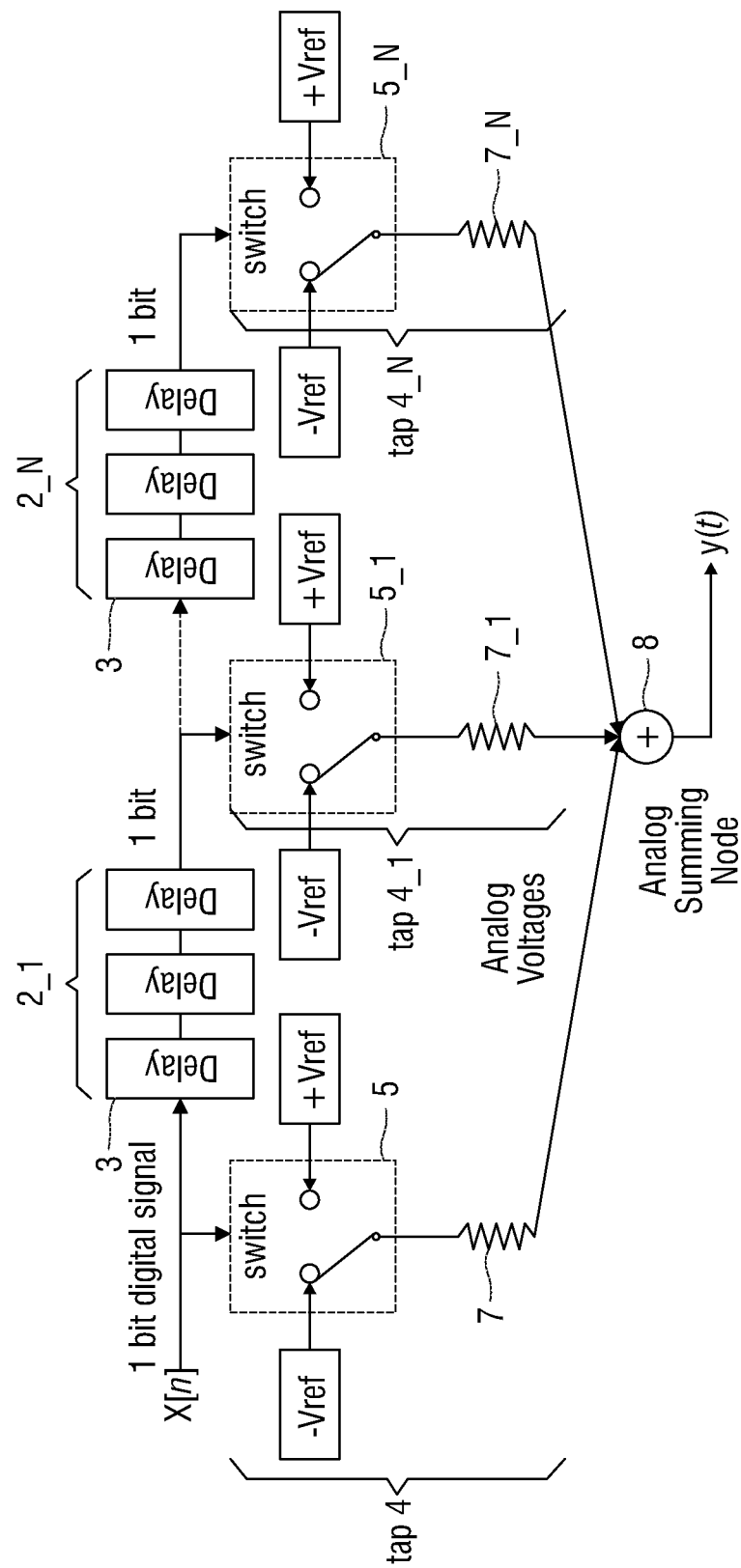
FIG. 1 is a combined block diagram and circuit schematic of an imaged, semi-digital FIR filter configured for digital to analog conversion.
Figure 3:
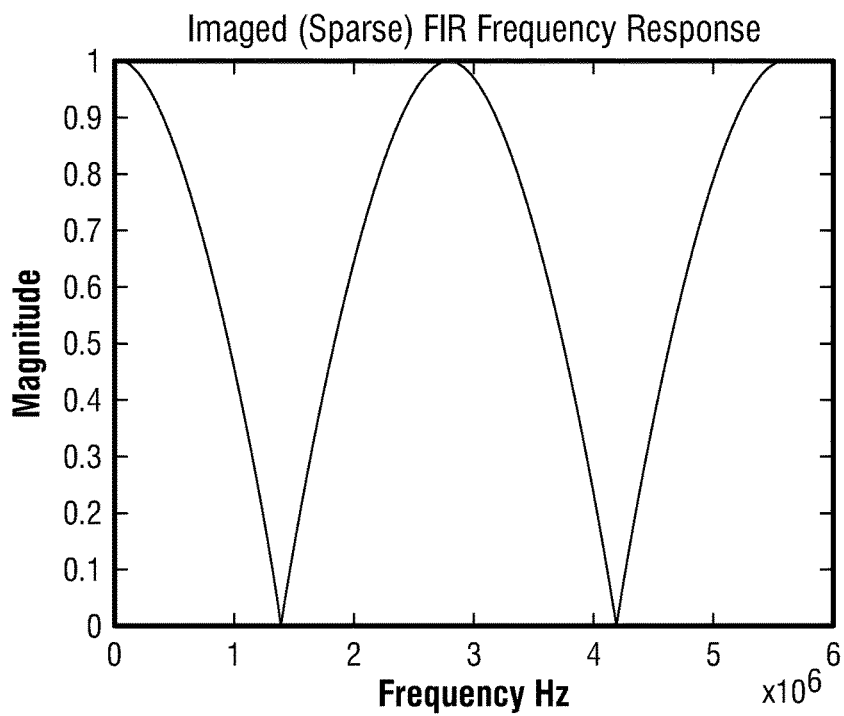
FIG. 3 shows a magnitude frequency response of an example, imaged FIR filter.

Referring now to FIG. 1, this figure illustrates an embodiment of the invention as a semi-digital FIR filter that is also described here as an "imaged" semi-digital FIR filter, for reasons that will become clear in connection with FIG. 3 and FIG. 4. As seen by comparing FIG. 1 with FIG. 5, the imaged filter structure is composed of a number of sets 2_1, 2_2, ... 2_N of delay units 3, that are sequentially coupled to each other to form a delay line whose input is to receive the digital input signal x[n]. Each set 2_1, 2_2, ... 2_N of delay units 3 is a cascade of two or more single-sample delay units 3. In the example of FIG. 1, each set 2_1, 2_2, ... 2_N is a cascade of three, single-sample delay units 3. More generally, in each set 2_1, 2_2, ... 2_N of delay units, there may be a cascade of two or more delay units 3, being composed of at least a front most delay unit and at least a back most delay unit, where the front most delay unit is at the input of the set and the back most delay unit provides the output of the set. Note how the input of the back most delay unit is untapped. Also, there may be one or more intermediate delay units (between the front most delay and the back most delay unit.)

Notice that in contrast to the "non-imaged" semi-digital FIR filter of FIG. 5, the imaged filter in FIG. 1 contains two additional, single-sample delay units 3 placed in between adjacent taps, that are "unused" or un-tapped. In other words, not every delay unit 3 of the filter of FIG. 1 is tapped (by one of the taps 4_1, 4_2, ... 4_N). Viewed another way, the coefficients or weightings of the FIR structure, which are defined within the taps 4, 4_1, 4_2, ... 4_N, are not applied to every delay output. This may also be viewed as inserting one or more zeroes between otherwise adjacent taps. This is said to result in an "imaged" FIR filter, due to the creation of images of a baseband signal in the frequency response of the filter, that are replicated at the higher frequencies, as seen in FIG. 3. Contrast the imaged frequency response of FIG. 3 with the non-imaged frequency response in FIG. 4. In this example, there are at least three images of the baseband frequency response that have been formed due to the addition of two unused delay units 3 between each pair of adjacent taps, where an unused delay unit is a delay unit whose output is not directly controlling any coefficient or weighting of the filter structure. More generally, the number of such images depends on the number of unused delays that are inserted between adjacent taps.

An advantageous effect of the imaged, low pass frequency response in FIG. 3 is how the cut off (or corner) frequency in the baseband has been lowered by about one MHz, relative to the non-imaged, low pass response shown in FIG. 4 (for the filter of FIG. 5.) Thus, while the imaged FIR filter of FIG. 1 has the same number of taps or coefficients as that of FIG. 5, its frequency response has a lower corner frequency. This means that the noise content within the baseband, here 20 kHz-1.4 MHz, is removed more effectively (by the imaged FIR filter of FIG. 1.) Although as seen in FIG. 3 the imaged FIR filter also produces images of the baseband response, at the higher frequencies, these can be readily removed by passing the analog output y(t)—see FIG. 1—through an analog low pass filter (not shown) having a corner frequency that is near the upper limit of the baseband.

Now, if a conventional, linear phase filter constraint is imposed when designing the imaged FIR filter of FIG. 1, then that would result in a higher latency relative to the non-imaged FIR structure, due to the additional delay units 3 that have been added. However, this latency increase can be mitigated by, instead of a linear phase filter constraint, requiring a minimum phase filter constraint when designing or computing the filter coefficients. In other words, the filter coefficients or tap weightings may be configured so that the semi-digital, imaged FIR filter is a minimum phase lag filter. This constraint (minimum phase lag) on the computation of the filter coefficients is readily available in conventional, computer aided digital filter design software, where it will be understood by those of ordinary skill of the art that such a constraint will result in a non-symmetrical set of filter coefficients.

FIG. 1 shows a particular implementation of the semi-digital, imaged FIR filter in which the taps 4, 4_1, 4_2, ..., 4_N that are sequentially coupled to the delay line are designed to implement a voltage mode solution similar to the one in FIG. 5, for performing the DAC (that is producing the analog output y(t).) Similar to FIG. 5, the outputs of the taps 4, 4_1, 4_2, ... 4_N are combined by the analog summing node 8, which may include a "load" resistor having a known resistance, across which the analog output y(t) is formed as a voltage. Each tap has a voltage source that is selected from between two voltage sources, here +Vref and −Vref, and a resistor 7: the weighting of the tap is defined in part by the resistance of the resistor 7 and the value of the selected voltage source. In particular, each tap 4, 4_1 . . . 4_N in this example includes a single pole multiple throw switch 5 whose single pole is coupled to one end of the resistor 7, while its "throws" (in this case, two) are coupled to different voltage source nodes, here +Vref and −Vref, respectively. In each tap, the switch 5 can be configured into one of two positions, in accordance with a single bit (or binary value) that arrives in the sequence x[n], into the delay unit 3 associated with the tap. In other words, the position of the switch 5 is controlled by the input of the tap that is coupled to the delay line and that is to receive the input value or sample associated with the position of the tap (at that moment in time.) Said another way, the weighting or filter coefficient of a tap is controlled by its switch 5, which responds to the 1-bit value that is currently in the position associated with that tap.

An alternative to the voltage mode solution depicted in FIG. 1 is a current steering or current mode solution, where each tap includes a single pole multiple throw switch whose single pole is coupled to one end of a current source, while one of the throws is at the output of the tap (making the resistor 7 unnecessary.) The position of the switch 5 is still controlled by the input of the tap, which is coupled to the delay line. The output analog signal y(t) in this case is produced as a sum of individual currents, where each tap may be an individual current source that is set to a known value and is either connected or disconnected from the analog summing node 8 in accordance with the input sample value or bit of the current digital word that is being converted.

In accordance with an embodiment of the invention, a DAC circuit has a semi-digital FIR filter that is designed to be both a sparse FIR filter and a minimum phase lag FIR filter. The filter has a number of sets of delay units, which are sequentially coupled to each other to form a delay line. A number of taps are coupled to the delay line, where each tap has i) an input that is coupled to the output of a respective one of the sets of delay units and ii) an output. Some of the sets of delay units have one or more untapped delay units, as part of a cascade of two or more single-sample delay units. An analog summing node has a number of inputs that are coupled to the outputs of the taps, respectively, as shown in FIG. 1, and produces at its output an analog version of a digital input signal that is fed to an input of the delay line. The digital input signal may be a PDM stream, where the PDM stream may be a 1-bit sequence, for example. In a voltage mode embodiment, as seen in FIG. 1, each tap has a resistor 7 through which a selected one of at least two voltage sources (e.g., +Vref, −Vref), as selected by the position of a switch that is controlled by the input of the tap,
drives the output of the tap. In one embodiment, the weightings of all of the taps (as defined by the resistance of the resistor 7 and the voltage sources in each tap) are the same. The outputs of the taps are combined by an analog summing node. Each tap is controlled by a current bit of the input sequence, while the outputs of the taps are combined at the output of the analog summing node as an analog version of the digital input sequence.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, it was suggested above that the DAC circuit may be used in combination with an audio amplifier, where the analog output y(t) of the semi-digital imaged FIR filter (which is an analog version of the digital input signal x[n]), is in the audio band (e.g., 0 Hz-20 kHz) and is coupled to an input of an audio amplifier such as a class D audio amplifier (not shown). However, the techniques described above for digital to analog conversion may also be applicable to other band-limited digital signals x[n]. Also, while FIG. 1 shows that each set 2_1, 2_2, . . . 2_N of delay units 3 is a cascade of the same number of two or more delay units 3 (here, each set is a cascade of three delay units 3), an alternative may be to have a non-uniform distribution of delay units across the sets 2_1, 2_2, . . . 2_N. The description is thus to be regarded as illustrative instead of limiting.

What is claimed is:

1. A digital to analog conversion circuit comprising:
a semi-digital finite impulse response, FIR, filter having
a plurality of sets of digital delay units that are sequentially coupled to each other to form a delay line whose input is to receive a digital input signal, wherein each set of delay units is a cascade of the same number of two or more single-sample delay units;
a plurality of taps having inputs coupled to the delay line, wherein the inputs of each pair of adjacent taps in the plurality of taps are separated by a respective one of the plurality of sets of delay units; and
an analog summing node having i) a plurality of inputs coupled to the-outputs of the plurality of taps, respectively, and ii) an analog output at which an analog version of the digital input signal is produced.

2. The digital to analog conversion circuit of claim 1 wherein the digital input signal comprises a pulse density modulation, PDM, stream.

3. The digital to analog conversion circuit of claim 2 wherein the PDM stream is a 1-bit sequence.

4. The digital to analog conversion circuit of claim 1 wherein in each set of delay units, which is a cascade of two or more delay units being at least a front most delay unit and at least a back most delay unit, an input of the back most delay unit is untapped by the plurality of taps.

5. The digital to analog conversion circuit of claim 1 wherein in each set of delay units, which is a cascade of two or more delay units being at least a front most delay unit and at least a back most delay unit, an output of the front most delay unit is untapped by the plurality of taps.

6. The digital to analog conversion circuit of claim 1 in combination with an audio amplifier, wherein the analog output of the semi-digital FIR filter is coupled to an input of the audio amplifier.

7. The digital to analog conversion circuit of claim 1 wherein in each set of delay units, which is a cascade of two or more delay units being at least a front most delay unit and at least a back most delay unit, an input of the back most delay unit is untapped by the plurality of taps, and an output of the front most delay unit is untapped by the plurality of taps.

8. The digital to analog conversion circuit of claim 1 wherein each tap comprises a single pole-multiple throws switch whose single pole is coupled to one end of a resistor, and whose multiple throws are coupled to multiple voltage source nodes, respectively, wherein position of the switch is controlled by the input of the tap that is coupled to the delay line.

9. The digital to analog conversion circuit of claim 1 wherein each tap comprises a single pole-multiple throws switch whose single pole is coupled to one end of a current source, and one of the multiple throws is at the output of the tap, wherein position of the switch is controlled by the input of the tap that is coupled to the delay line.

10. The digital to analog conversion circuit of claim 1 wherein the plurality of taps have a plurality of weightings, respectively, and the plurality of weightings are configured so that the FIR filter is a minimum phase lag filter.

11. The digital to analog conversion circuit of claim 10 wherein each tap comprises a voltage source and a resistor that together define the weighting of the tap.

12. The digital to analog conversion circuit of claim 10 wherein each tap comprises a current source that defines the weighting of the tap.

13. A digital to analog conversion circuit comprising:
a semi-digital finite impulse response, FIR, filter having
a plurality of sets of delay units that are sequentially coupled to each other to form a delay line whose input is to receive a digital input signal;
a plurality of taps having inputs coupled to the delay line, wherein the inputs of each pair of adjacent taps in the plurality of taps are separated by a respective one of the plurality of sets of delay units and wherein each set of delay units is a cascade of the same number of two or more single-sample delay units; and
an analog summing node having a plurality of inputs coupled to outputs of the plurality of taps, respectively, and an analog output at which an analog version of the digital input signal is produced,
wherein the semi-digital FIR filter is a minimum phase lag FIR filter.

14. The digital to analog conversion circuit of claim 13 wherein each set of delay units is a cascade of two or more single-sample delay units being at least a front most delay unit and at least a back most delay unit, an input of the back most delay unit is untapped by the plurality of taps.

15. The digital to analog conversion circuit of claim 13 wherein in each set of delay units, which is a cascade of two or more delay units being at least a front most delay unit and at least a back most delay unit, an input of the back most delay unit is untapped by the plurality of taps, and an output of the front most delay unit is untapped by the plurality of taps.

16. The digital to analog conversion circuit of claim 13 wherein each tap comprises a resistor, a voltage source node, and a switch wherein position of the switch is controlled by the input of the tap that is coupled to the delay line.

17. The digital to analog conversion circuit of claim 13 wherein each tap comprises a switch and a current source, wherein position of the switch is controlled by the input of the tap that is coupled to the delay line.

* * * * *